United States Patent
Moh

(10) Patent No.: US 9,551,757 B2
(45) Date of Patent: Jan. 24, 2017

(54) MEASURING DEVICES OF REMAINING BATTERY LIFE AND MEASURING METHODS THEREOF

(71) Applicant: Samsung Electronics Co., Ltd., Suwon-Si, Gyeonggi-Do (KR)

(72) Inventor: Kyunggoo Moh, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 627 days.

(21) Appl. No.: 14/051,765

(22) Filed: Oct. 11, 2013

(65) Prior Publication Data

US 2014/0149058 A1    May 29, 2014

(30) Foreign Application Priority Data

Nov. 23, 2012  (KR) .................. 10-2012-0133557

(51) Int. Cl.
  *G01R 31/36*  (2006.01)
(52) U.S. Cl.
  CPC ......... *G01R 31/3624* (2013.01); *G01R 31/361* (2013.01); *G01R 31/362* (2013.01); *G01R 31/3651* (2013.01)
(58) Field of Classification Search
  USPC ......................................................... 702/63
  See application file for complete search history.

(56) References Cited

U.S. PATENT DOCUMENTS

| 7,557,540 B2 | 7/2009 | Kao et al. |
| 7,982,433 B2 | 7/2011 | Lim et al. |
| 8,108,160 B2 | 1/2012 | Liu et al. |

(Continued)

FOREIGN PATENT DOCUMENTS

| JP | 2012047580 A | 3/2012 |
| JP | 2012057964 A | 3/2012 |
| KR | 20100072237 A | 6/2010 |

OTHER PUBLICATIONS

Fabio Codecà et al., "The Mix of Estimation Algorithm for Battery State-of-Charge Estimator—Analysis of the Sensitivity to Measurement Errors", Joint 48th IEEE Conference on Decision and Control and 28th Chinese Control Conference Shanghai, P.R. China, Dec. 16-18, 2009.

(Continued)

*Primary Examiner* — Tung Lau
(74) *Attorney, Agent, or Firm* — Harness, Dickey & Pierce, PLC

(57) ABSTRACT

A remaining battery life measuring device may include a first estimator configured to estimate a state of charging of a battery using an open circuit voltage of the battery; a second estimator configured to estimate the state of charging of the battery using charge, discharge, or charge and discharge currents of the battery; a correction unit configured to generate a correction value on the state of charging estimated by the second estimator, based on the state of charging estimated by the first estimator or an output state of charging; and/or a state of charging (SOC) processing unit configured to calculate the output state of charging using the state of charging estimated by the second estimator and an accumulated correction value. The accumulated correction value may be generated based on the correction value.

20 Claims, 10 Drawing Sheets

(56) References Cited

U.S. PATENT DOCUMENTS

| | | |
|---|---|---|
| 2007/0029973 A1* | 2/2007 | Ashizawa ............ G01R 31/361 320/132 |
| 2007/0148532 A1 | 6/2007 | Lim et al. |
| 2007/0170893 A1 | 7/2007 | Kao et al. |
| 2008/0233469 A1 | 9/2008 | Drozdz et al. |
| 2010/0076704 A1 | 3/2010 | Liu et al. |
| 2010/0225325 A1 | 9/2010 | Christensen et al. |
| 2011/0234167 A1 | 9/2011 | Kao et al. |
| 2011/0309838 A1 | 12/2011 | Lin et al. |

OTHER PUBLICATIONS

Min Chen et al., "Accurate Electrical Battery Model Capable of Predicting Runtime and I-V Performance", IEEE Transaction on Energy Conversion, vol. 21, No. 2, Jun. 2006, p. 504-511.
Mark Hamlett et al., "Smart Battery Analog Front End Architecture Comparison Integrated Voltage-to-Frequency Vs. Analog-to-Digital Converters", 2001 IEEE, p. 293-298.

* cited by examiner

MEASURING DEVICES OF REMAINING BATTERY LIFE AND MEASURING METHODS THEREOF

CROSS-REFERENCE TO RELATED APPLICATION(S)

This application claims priority from Korean Patent Application No. 10-2012-0133557, filed on Nov. 23, 2012, in the Korean Intellectual Property Office (KIPO), the entire contents of which are incorporated herein by reference.

BACKGROUND

1. Field

Some example embodiments may relate to devices and/or methods of measuring battery time remaining. Some example embodiments may relate to devices and/or methods of measuring battery time remaining by estimating the amount of charge in batteries.

2. Description of Related Art

Mobile electronic devices such as a cellular phone, a notebook computer, a portable game machine, an e-book terminal, and so on may be powered by a battery. Also, an electric vehicle using a battery engine operated by electrical energy from a battery may be becoming more common. In general, since a battery stores a limited amount of charge, it may supply power during the limited period of time.

If a battery is discharged, a mobile electronic device and an electric vehicle may not operate. If a battery is overdischarged, a life of the battery may be shortened. Thus, the mobile electronic device and the electric vehicle may measure a battery time remaining in real time to display a measured result to a user. The user may check the battery time remaining, use functions of the device selectively according to the battery time remaining, or charge the battery. Thus, it is required a technique of measuring a battery time remaining as accurately as possible. In particular, since an electric vehicle uses power of a battery, it is very important to measure a battery time remaining as accurately as possible.

SUMMARY

Some example embodiments may provide devices and/or methods of measuring battery time remaining.

In some example embodiments, a remaining battery life measuring device may comprise a first estimator configured to estimate a state of charging of a battery using an open circuit voltage of the battery; a second estimator configured to estimate the state of charging of the battery using charge and/or discharge currents of the battery; a correction unit configured to generate a correction value on the state of charging estimated by the second estimator, based on the state of charging estimated by the first estimator or an output state of charging; and/or a state of charging (SOC) processing unit configured to calculate the output state of charging using the state of charging estimated by the second estimator and an accumulated correction value. The accumulated correction value may be generated based on the correction value. The correction unit may be further configured to increase the correction value when a reliability of the state of charging estimated by the first estimator or the output state of charging is higher than a first desired value, and/or may be further configured to decrease the correction value when the reliability of the state of charging estimated by the first estimator or the output state of charging is lower than a second desired value.

In some example embodiments, the SOC processing unit may be further configured to add the accumulated correction value and the correction value when the state of charging estimated by the first estimator is larger than the output state of charging. The SOC processing unit may be further configured to subtract the correction value from the accumulated correction value when the state of charging estimated by the first estimator is smaller than the output state of charging.

In some example embodiments, the first estimator may comprise a table in which correspondence information between the open circuit voltage and the state of charging is stored.

In some example embodiments, the SOC processing unit may be further configured to calculate the output state of charging by adding the state of charging estimated by the second estimator and the accumulated correction value.

In some example embodiments, the correction unit may comprise a reliability judging unit configured to judge the reliability of the output state of charging or the reliability of the state of charging estimated by the first estimator, based on correspondence information between the open circuit voltage and the state of charging; and/or a correction value generator configured to calculate the correction value based on the reliability of the output state of charging or the reliability of the state of charging estimated by the first estimator.

In some example embodiments, the correspondence information between the open circuit voltage and the state of charging estimated by the first estimator may comprise a graph indicating a variation in the open circuit voltage to the state of charging. The reliability judging unit may be further configured to judge the reliability of the state of charging estimated by the first estimator based on a slope of a point of the graph corresponding to the output state of charging or the state of charging estimated by the first estimator.

In some example embodiments, the reliability judging unit may be further configured to judge the reliability of the state of charging estimated by the first estimator to be higher than the first desired value when the slope of the point corresponding to the output state of charging or the slope of the point corresponding to the state of charging estimated by the first estimator is larger than a third desired value.

In some example embodiments, the correction value generator may be further configured to calculate the correction value using a minimum value of the slope of the graph and the slope of the point of the graph corresponding to the state of charging estimated by the first estimator. The correction value generator may be further configured to calculate the correction value using the minimum value of the slope of the graph and the slope of the point corresponding to the output state of charging.

In some example embodiments, the second estimator may be further configured to estimate the state of charging by integrating the charge and/or discharge currents.

In some example embodiments, a method of measuring a remaining battery life may comprise estimating a first state of charging of a battery using an open circuit voltage of the battery; estimating a second state of charging of the battery using charge and/or discharge currents of the battery; generating a correction value on the second state of charging, based on the first state of charging or an output state of charging; and/or calculating an accumulated correction value using the correction value, and calculating a new output state of charging using the second state of charging and the accumulated correction value. The first state of charging and the second state of charging may be estimated independently from each other. The correction value may be increased when a reliability of the first state of charging or the output state of charging is higher than a first desired value. The correction value may be decreased when the reliability of the first state of charging or the output state of charging is lower than a second desired value.

In some example embodiments, the calculating of the accumulated correction value using the correction value, and the calculating of the new output state of charging using the second state of charging and the accumulated correction value may comprise adding the accumulated correction value and the correction value when the first state of charging is larger than the output state of charging; subtracting the correction value from the accumulated correction value when the first state of charging is smaller than the output state of charging; and/or calculating the new output state of charging by adding the second state of charging and the accumulated correction value.

In some example embodiments, the generating of the correction value on the second state of charging, based on the first state of charging or the output state of charging, may comprise judging the reliability of the first state of charging or the output state of charging using correspondence information between a state of charging and an open circuit voltage; and/or generating the correction value based on the reliability of the first state of charging or the output state of charging.

In some example embodiments, the correspondence information between the state of charging and the open circuit voltage may comprise a graph indicating a variation in the open circuit voltage to the state of charging. The judging of the reliability of the first state of charging or the output state of charging using the correspondence information between the state of charging and the open circuit voltage may comprise judging the reliability of the first state of charging using a slope of a point of the graph corresponding to the first state of charging, and judging the reliability of the output state of charging using a slope of a point of the graph corresponding to the output state of charging.

In some example embodiments, the generating the correction value on the second state of charging, based on the first state of charging or the output state of charging, may comprise calculating the correction value using the slope of the point of the graph corresponding to the first state of charging and a minimum value of the slope of the graph indicating the variation in an open circuit voltage to the state of charging; and/or calculating the correction value using the slope of the point corresponding to the output state of charging and the minimum value of the slope of the graph.

In some example embodiments, a remaining battery life measuring device may comprise a first unit configured to estimate a state of charging of a battery based on an open circuit voltage of the battery; a second unit configured to estimate the state of charging of the battery based on charge, discharge, or charge and discharge currents of the battery; a third unit configured to generate a correction value on the state of charging estimated by the second unit, based on the state of charging estimated by the first unit or an output state of charging; and/or a processor configured to calculate the output state of charging using the state of charging estimated by the second unit and an accumulated correction value. The accumulated correction value may be generated based on the correction value. The third unit may be further configured to increase the correction value when a reliability of the state of charging estimated by the first unit or the output state of charging is higher than a first desired value. The third unit may be further configured to decrease the correction value when the reliability of the state of charging estimated by the first unit or the output state of charging is lower than a second desired value.

In some example embodiments, the second unit may be configured to estimate the state of charging of the battery based on the charge currents of the battery.

In some example embodiments, the second unit may be configured to estimate the state of charging of the battery based on the discharge currents of the battery.

In some example embodiments, the second unit may be configured to estimate the state of charging of the battery based on the charge and discharge currents of the battery.

In some example embodiments, the processor may be further configured to add the accumulated correction value and the correction value when the state of charging estimated by the first unit is larger than the output state of charging.

In some example embodiments, the processor may be further configured to subtract the correction value from the accumulated correction value when the state of charging estimated by the first unit is smaller than the output state of charging.

In some example embodiments, the first unit may comprise a table in which correspondence information between the open circuit voltage and the state of charging is stored.

In some example embodiments, the processor may be further configured to calculate the output state of charging by adding the state of charging estimated by the second unit and the accumulated correction value.

In some example embodiments, the third unit may comprise a first sub-unit configured to judge the reliability of the output state of charging or the reliability of the state of charging estimated by the first unit, based on correspondence information between the open circuit voltage and the state of charging.

In some example embodiments, the third unit may further comprise a second sub-unit configured to calculate the correction value based on the reliability of the output state of charging or the reliability of the state of charging estimated by the first unit.

In some example embodiments, the correspondence information between the open circuit voltage and the state of charging estimated by the first unit may comprise a graph indicating a variation in the open circuit voltage to the state of charging.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
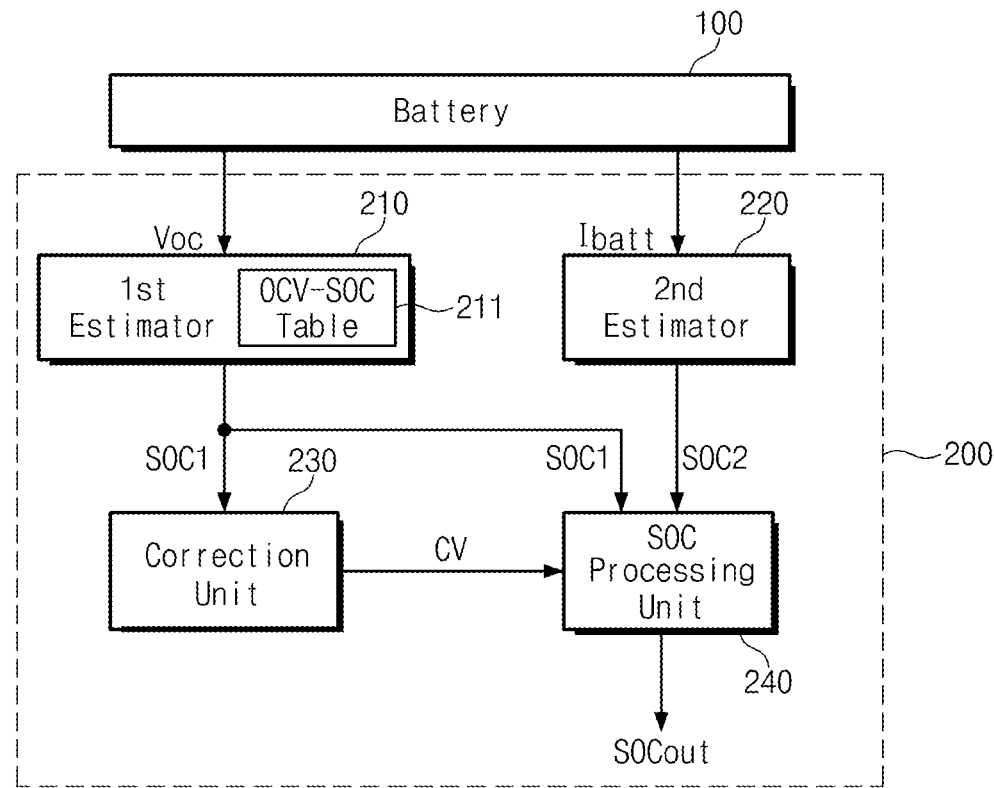
FIG. 1 is block diagram schematically illustrating a remaining battery life measuring device according to some example embodiments of the inventive concept.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
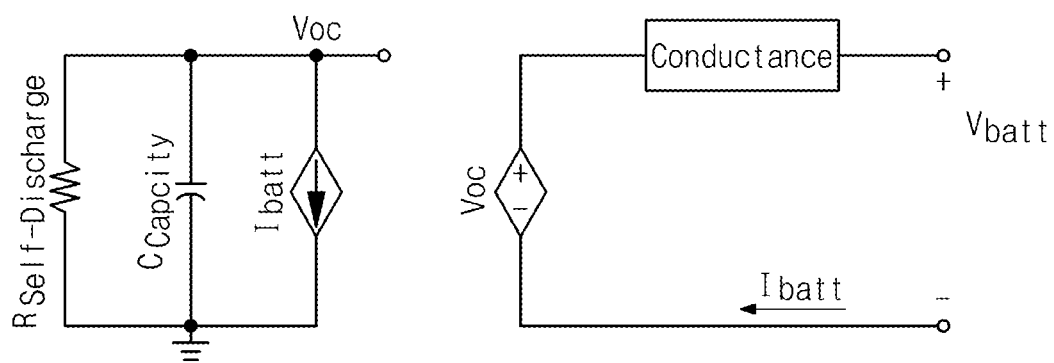
FIG. 2 is an equivalent circuit diagram of a battery of FIG. 1.

FIG. 1 is block diagram schematically illustrating a remaining battery life measuring device according to some example embodiments of the inventive concept. FIG. 2 is an equivalent circuit diagram of a battery of FIG. 1, including self-discharge resistance $R_{Self\text{-}Discharge}$, internal capacitance $C_{capacity}$, and internal conductance CONDUCTANCE.

Referring to FIG. 1, a remaining battery life measuring device 200 may be connected with a battery 100 and measure an amount of charge of the battery 100. Below, it is assumed that the battery 100 is a Li-Ion battery. However, the inventive concept is not limited thereto. The inventive concept may be applied to devices which measure a remaining battery life of other kinds of battery (e.g., a nickel-cadmium battery, a nickel-hydride battery, a lithium-ion polymer battery, etc.).

The remaining battery life measuring device 200 according to some example embodiments of the inventive concept may include a first estimator 210, a second estimator 220, a correction unit 230, and a state of charging (SOC) processing unit 240.

Referring to FIGS. 1 and 2, the first estimator 210 may estimate an open circuit voltage (OCV) Voc from a variation in a terminal voltage Vbatt of the battery 100 to a time, and may estimate a state of charging SOC of the battery 100 using the estimated open circuit voltage Voc.

The open circuit voltage Voc may be estimated by a variation in the measured terminal voltage Vbatt according to a lapse of time and proper modeling of internal conductance. Since the internal conductance varies according to temperature and battery characteristics, it is difficult to measure the internal conductance exactly. Also, since a current Ibatt flowing according to an operating state of the battery 100 is varied, it is difficult to estimate the open circuit voltage Voc. Thus, an error may be generated at SOC estimation according to whether the internal conductance is estimated to correspond to actual internal conductance when the first estimator 210 estimates the open circuit voltage Voc. A method of estimating the open circuit voltage Voc from a variation in a measured external terminal voltage Vbatt according to a lapse of time is well known in the art, and a detailed description thereof is thus omitted.

The first estimator 210 may include an OCV-SOC table 211. The OCV-SOC table 211 may include information indicating correspondence between an open circuit voltage (OCV) Voc and a state of charging SOC. For example, the OCV-SOC table 211 may be formed of a read-only memory (ROM). The first estimator 210 may estimate the state of charging SOC corresponding to the open circuit voltage Voc, based on the OCV-SOC table 211. The estimated state of charging SOC may be transferred to the correction unit 230 and the SOC processing unit 240.

The second estimator 220 may estimate the state of charging SOC of the battery 100 using charge and/or discharge currents of the battery 100. For example, the second estimator 220 may estimate the state of charging SOC of the battery 100 according to a Coulomb counter method. The second estimator 220 may estimate the state of charging SOC of the battery 100 by integrating charge and/or discharge currents of the battery 100 over time.

Meanwhile, since the second estimator 220 estimates the state of charging SOC according to the Coulomb counter method, an error (e.g., analog-to-digital converter (ADC) offset) generated at an SOC estimating operation (e.g., a current measuring operation) may be integrated and continues to increase.

That is, the first estimator 210 and the second estimator 220 may estimate the state of charging SOC of the battery 100, respectively.

The correction unit 230 may generate a correction value CV based on a reliability judging result of the state of charging SOC estimated by the first estimator 210. The correction unit 230 may judge the reliability of the state of charging SOC estimated by the first estimator 210. The reliability may mean an error rate of the estimated state of charging SOC on an estimation error of the open circuit voltage Voc. For example, in the event that the error rate of the estimated state of charging SOC on the estimation error of the open circuit voltage Voc is large, the reliability may be determined to be low. In the event that the error rate of the estimated state of charging SOC on the estimation error of the open circuit voltage Voc is small, the reliability may be determined to be high.

For example, the correction unit 230 may increase the correction value CV when the reliability is low, and decrease the correction value CV when the reliability is high. As a result, the correction unit 230 may calculate the correction value CV based on the state of charging SOC provided from the first estimator 210, and may transfer the calculated correction value CV to the SOC processing unit 240. An operation of the SOC processing unit 240 will be more fully described with reference to FIG. 3.

The SOC processing unit 240 may calculate an accumulated correction value SOCoffset. In detail, when a first state of charging SOC1 from the first estimator 210 is larger than an output state of charging SOCout, the SOC processing unit 240 may calculate the accumulated correction value SOCoffset by adding the accumulated correction value SOCoffset and the correction value CV. When the first state of charging SOC1 from the first estimator 210 is smaller than the output state of charging SOCout, the SOC processing unit 240 may calculate the accumulated correction value SOCoffset by subtracting the correction value CV from the accumulated correction value SOCoffset. The accumulated correction value SOCoffset may mean a correction value generated when the correction value CV is accumulated according to iteration of an output state of charging SOCout calculating operation. Herein, the output state of charging SOCout may mean an output state of charging SOCout previously generated.

The SOC processing unit 240 may calculate the output state of charging SOCout using a second state of charging SOC2 estimated by the second estimator 220 and the accumulated correction value SOCoffset. For example, the SOC processing unit 240 may calculate the output state of charging SOCout by adding the second state of charging SOC2 provided from the second estimator 220 and the accumulated correction value SOCoffset.

As described above, the first estimator 210 may generate an error when the open circuit voltage Voc is estimated, and such an error may result in an SOC estimation error. Since the second estimator 220 estimates the state of charging SOC according to the Coulomb counter method, an error (e.g., ADC offset) generated at an SOC estimating operation (e.g., a current measuring operation) may be integrated and continues to increase.

Also, the remaining battery life measuring device 200 may measure a remaining battery life of the battery 100 continuously and in real time. An SOC estimation error generated from the first estimator 210 may be more than an SOC estimation error generated from the second estimator 220 in the short term. However, the SOC estimation error generated from the first estimator 210 may vary within a constant range in the long term. On the other hand, an SOC estimation error generated from the second estimator 220 may be less than an SOC estimation error generated from the first estimator 210 in the short term. However, the SOC estimation error generated from the second estimator 220 may be accumulated due to integration in the long term.

The remaining battery life measuring device 200 according to some example embodiments of the inventive concept may calculate the correction value CV based on the reliability of a state of charging SOC estimated by the first estimator 210, and may accumulate the correction value CV generated to calculate the accumulated correction value SOCoffset. Also, the remaining battery life measuring device 200 may calculate the output state of charging SOCout by adding the second state of charging SOC2 estimated by the second estimator 220 and the accumulated correction value SOCoffset. Thus, it is possible to prevent an error of the output state of charging SOCout from being continuously accumulated.

In the event that the reliability of state of charging SOC estimated by the first estimator 210 is high, influence of the state of charging SOC estimated by the first estimator 210 on the output state of charging SOCout may increase by increasing the correction value CV. In the event that the reliability of state of charging SOC estimated by the first estimator 210 is low, influence of the state of charging SOC estimated by the first estimator 210 on the output state of charging SOCout may decrease by decreasing the correction value CV.

Thus, it is possible to reduce an SOC estimation error generated in the short term when a battery time remaining is measured. Also, it is possible to maintain an SOC estimation error, generated in the long term when a battery time remaining is measured, within a constant range. As a result, a battery time remaining may be measured as accurately as possible.

Figure 3:
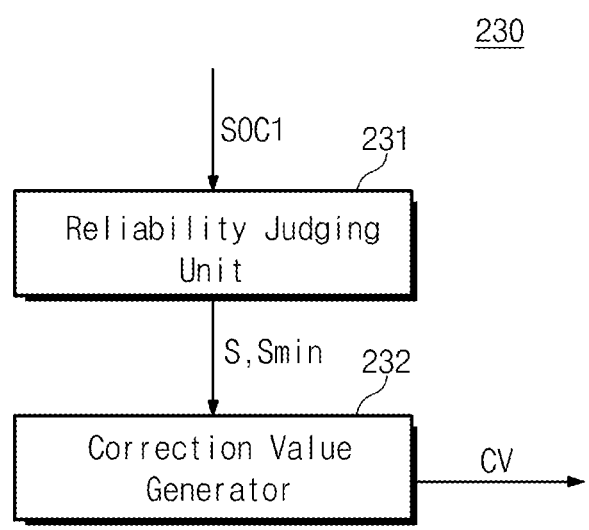
FIG. 3 is a block diagram schematically illustrating a correction unit of FIG. 1.
Figure 4A:
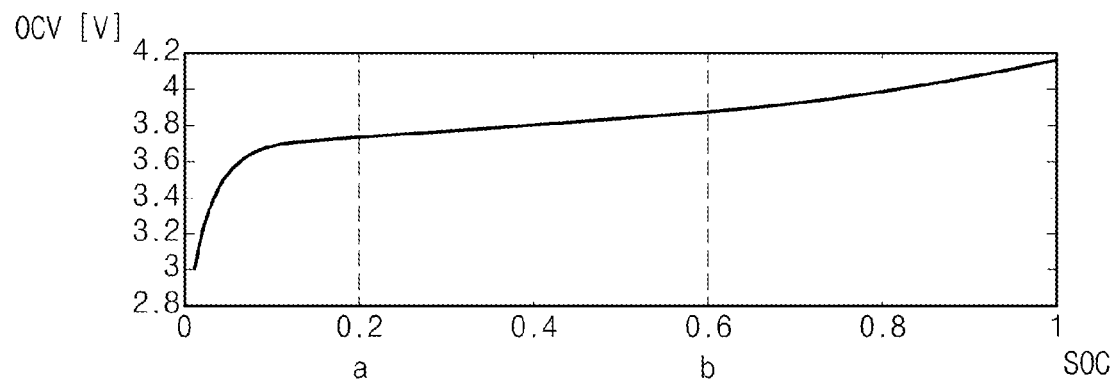
FIGS. 4A and 4B are graphs for describing an operation of a correction unit of FIG. 3.
Figure 4B:
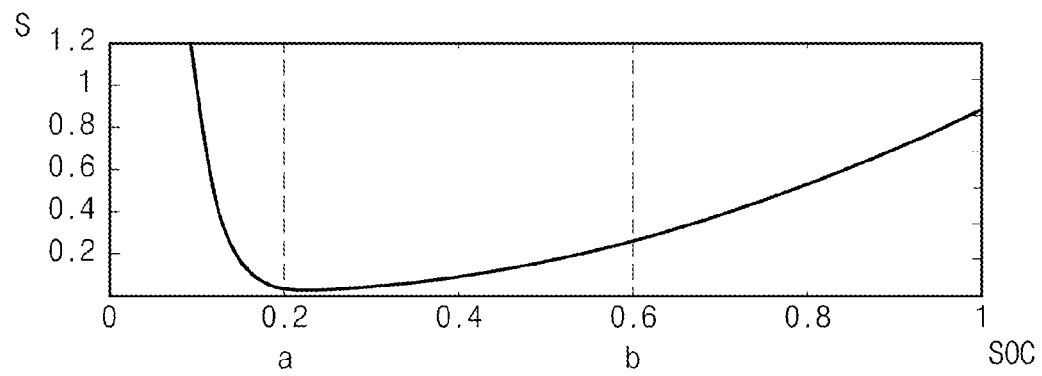

FIG. 3 is a block diagram schematically illustrating a correction unit of FIG. 1. FIGS. 4A and 4B are graphs for describing an operation of a correction unit of FIG. 3. In FIGS. 4A, a vertical axis may indicate an open circuit voltage (OCV) Voc, and a horizontal axis may indicate a state of charging SOC (e.g., a normalized SOC).

Referring to FIG. 3, a correction unit 230 may include a reliability judging unit 231 and a correction value generator 232.

The reliability judging unit 231 may judge the reliability of the state of charging SOC provided from a first estimator 210 (refer to FIG. 1) based on correspondence between state of charging SOC and OCV. The reliability judging unit 231 may store information of correspondence between state of charging SOC and OCV in database beforehand. The correspondence between state of charging SOC and OCV may be a graph indicating a variation in the open circuit voltage Voc to the state of charging SOC.

Referring to FIG. 4A, a graph, which is indicating a variation in the open circuit voltage Voc to the state of charging SOC, is illustrated. Referring to FIG. 4B, a slope of the graph of FIG. 4A to a normalized SOC is illustrated. As described above, the graph of FIG. 4A may be stored in database by the reliability judging unit 231 in advance.

The reliability judging unit 231 may judge the reliability of the state of charging SOC provided from the first estimator 210, based on a slope S of a point corresponding to the state of charging SOC provided from the first estimator 210, by using the graph indicating a variation in the open circuit voltage Voc to the state of charging SOC. For example, when a slope S of a point corresponding to the state of charging SOC provided from the first estimator 210 is large, the reliability judging unit 231 may judge the reliability to be high. For example, when a slope S of a point corresponding to the state of charging SOC provided from the first estimator 210 is larger than a desired value (that may or may not be predetermined), the reliability judging unit 231 may judge the reliability to be high. The reason may be that an SOC estimation error according to an OCV estimation error is reduced in proportion to an increase in a slope of a graph indicating a variation in the open circuit voltage Voc to the state of charging SOC.

For example, a variation in the state of charging SOC according to a variation in the open circuit voltage OCV may be large at a period between 'a' and 'b'. On the other hand, compared with the period between 'a' and 'b', a variation in the state of charging SOC according to a variation in the open circuit voltage OCV may be relatively small at periods between 0 and 'a' and between 'b' and 1. The points 'a' and 'b' may be exemplary. The inventive concept is not limited thereto.

Returning to FIG. 3, the correction value generator 232 may calculate a correction value CV based on the reliability judged by the reliability judging unit 231. The correction value generator 232 may be provided with a slope S of a point corresponding to the state of charging SOC from the first estimator 210 and a minimum value of a slope Smin (Smin being a real number not including 0) of a graph indicating a variation in the OCV to the state of charging SOC, from the reliability judging unit 231. The correction value generator 232 may calculate the correction value CV using a slope S of a point corresponding to the state of charging SOC provided from the first estimator 210 and a minimum value of a slope Smin (Smin being a real number not including 0) of a graph indicating a variation in the OCV to the state of charging SOC.

For example, the correction value generator 232 may calculate the correction value CV using the follow equation (1).

$$CV = A + B * \frac{S}{S\min} \quad (1)$$

In equation (1), "A" and "B" may be arbitrary real numbers not being "0", and "S" and "Smin" may be real numbers not being "0".

For example, the correction value CV may increase in proportion to an increase in a slope S of a point corresponding to the state of charging SOC provided from the first estimator 210. On the other hand, the correction value CV may decrease in proportion to a decrease in a slope S of a point corresponding to the state of charging SOC provided from the first estimator 210. That is, the higher the reliability of the state of charging SOC provided from the first estimator 210 is, the larger the correction value CV is. The correction value generator 232 may reflect the reliability of the state of charging SOC estimated by the first estimator 210, by calculating the correction value CV using the equation (1).

Figure 5:
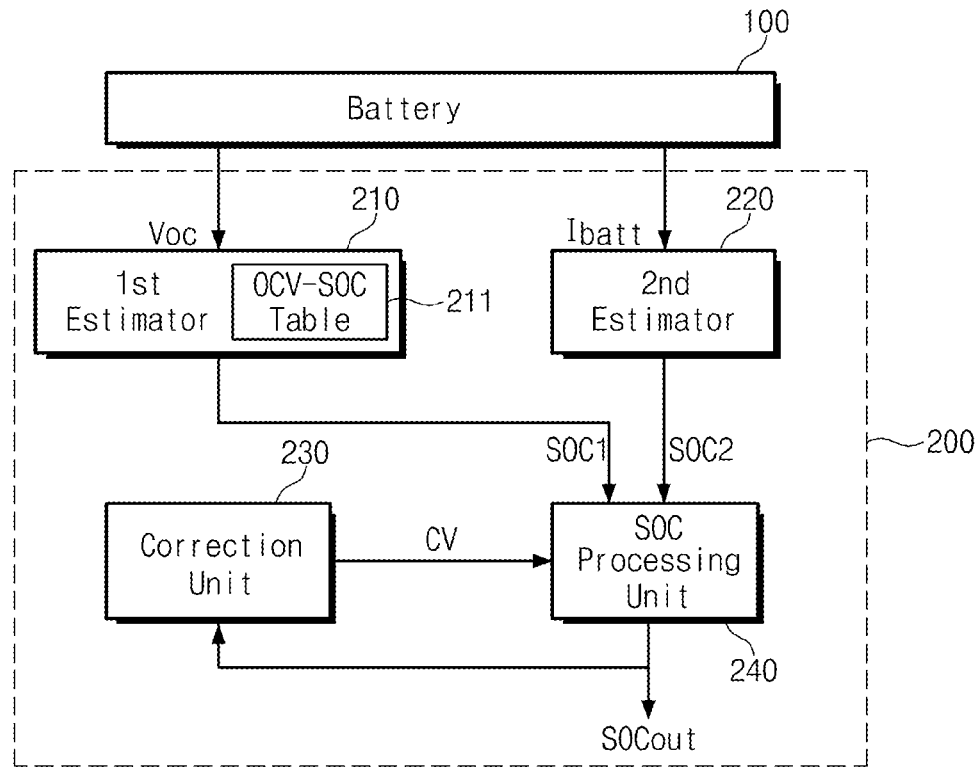
FIG. 5 is a block diagram schematically illustrating a remaining battery life measuring device according to some example embodiments of the inventive concept.

FIG. 5 is a block diagram schematically illustrating a remaining battery life measuring device according to some example embodiments of the inventive concept.

Referring to FIG. 5, a remaining battery life measuring device 200 may include a first estimator 210, a second estimator 220, a correction unit 230, and an SOC processing unit 240.

The first estimator 210, the second estimator 220 and the SOC processing unit 240 may be configured substantially the same as those in FIG. 1.

The correction unit 230 may generate a correction value CV using a reliability judgment result of an output state of charging SOCout. The correction unit 230 may judge the reliability of the output state of charging SOCout.

For example, if the reliability of the output state of charging SOCout is high, the correction unit 230 may increase the correction value CV. If the reliability of the output state of charging SOCout is low, the correction unit 230 may decrease the correction value CV. Thus, the correction unit 230 may calculate the correction value CV using the output state of charging SOCout provided from the SOC processing unit 240, and transfer the calculated correction value CV to the SOC processing unit 240. The correction unit 230 will be more fully described with reference to FIG. 6.

Figure 6:
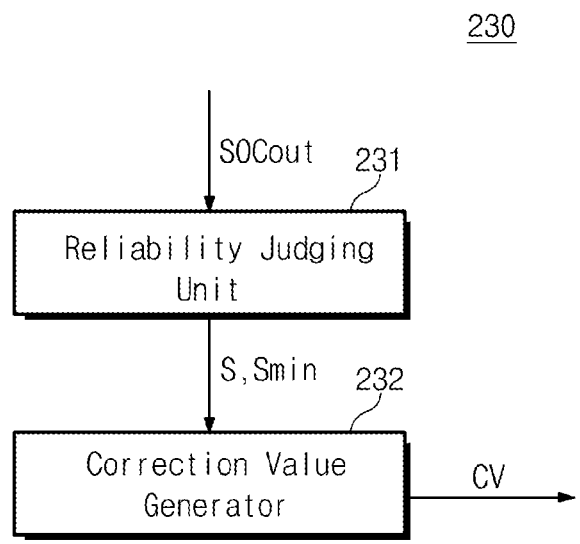
FIG. 6 is a block diagram schematically illustrating a correction unit of FIG. 5.

FIG. 6 is a block diagram schematically illustrating a correction unit of FIG. 5.

Referring to FIG. 6, a correction unit 230 may include a reliability judging unit 231 and a correction value generator 232.

The reliability judging unit 231 may judge the reliability of an output state of charging SOCout provided from the SOC processing unit 240 (refer to FIG. 5) based on correspondence between state of charging SOC and OCV. The reliability judging unit 231 may store information of correspondence between state of charging SOC and OCV in database beforehand. The correspondence between state of charging SOC and OCV may be a graph (refer to FIG. 4A) indicating a variation in the OCV to the state of charging SOC.

The reliability judging unit 231 may judge the reliability of the output state of charging SOCout, based on a slope S of a point corresponding to the output state of charging SOCout, by using the graph indicating a variation in the OCV to the state of charging SOC. For example, when a slope S of a point corresponding to the output state of charging SOCout is large, the reliability judging unit 231 may judge the reliability to be high. In some example embodiments, when a slope S of a point corresponding to the output state of charging SOCout is larger than a desired value (that may or may not be predetermined), the reliability judging unit 231 may judge the reliability to be high.

The correction value generator 232 may calculate a correction value CV based on the reliability judged by the reliability judging unit 231. The correction value generator 232 may be provided with a slope S of a point corresponding to the output state of charging SOCout and a minimum value of a slope Smin (Smin being a real number not including 0) of a graph indicating a variation in the OCV to the state of charging SOC, from the reliability judging unit 231. The correction value generator 232 may calculate the correction value CV using a slope S of a point corresponding to the output state of charging SOCout and a minimum value of a slope Smin (Smin being a real number not including 0) of a graph indicating a variation in the OCV to the state of charging SOC.

For example, the correction value generator 232 may calculate the correction value CV using the above-described equation (1).

Figure 7:
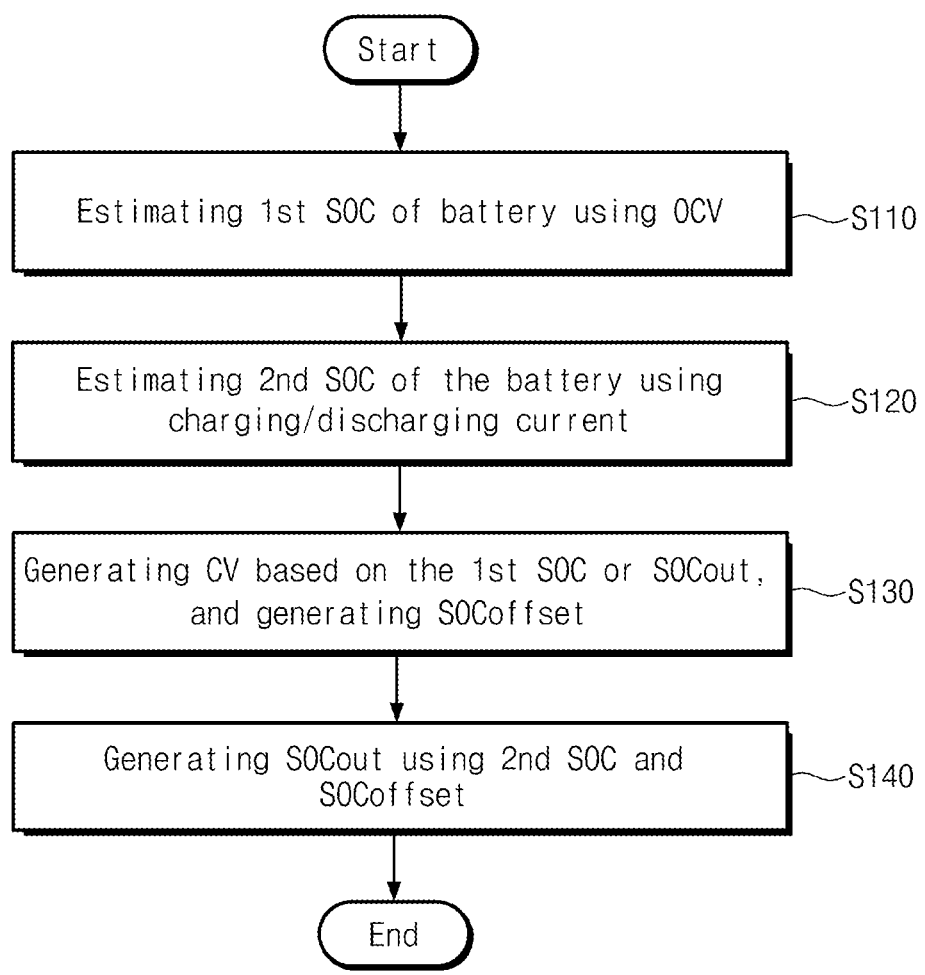
FIG. 7 is a flowchart schematically illustrating a remaining battery life measuring method according to some example embodiments of the inventive concept.

FIG. 7 is a flowchart schematically illustrating a remaining battery life measuring method according to some example embodiments of the inventive concept.

Referring to FIG. 7, a remaining battery life measuring method according to some example embodiments of the inventive concept may include estimating a first state of charging SOC1 of a battery 100 using an open circuit voltage Voc estimated from a variation in a battery terminal voltage to a time (S110); estimating a second state of charging SOC2 of the battery 100 using charge and/or discharge currents (S120); generating a correction value CV on the second state of charging SOC2, based on the first state of charging SOC1 or an output state of charging SOCout (S130); and generating an output state of charging SOCout using the second state of charging SOC2 and an accumulated correction value SOCoffset obtained by accumulating the correction value CV (S140).

Operations S110 and S120 may be executed independently from each other. That is, in operations S110 and S120, a first estimator 210 and a second estimator 220 may estimate a remaining battery life (or a battery time remaining) at the specific point of time, respectively.

In operation S110, the first estimator 210 may estimate an OCV from a variation in an external terminal voltage of the battery 100 to a time, and may estimate a first state of charging SOC1 using the estimated OCV. For example, in operation S110, the first estimator 210 may estimate the first state of charging SOC1 corresponding to the estimated OCV, based on a table in which information indicating correspondence between the OCV and the state of charging SOC is stored.

In operation S120, the second estimator 220 may estimate a second state of charging SOC2 according to a Coulomb counter method. For example, the second estimator 220 may estimate the second state of charging SOC2 by integrating charge and/or discharge currents of the battery 100.

In operation S130, the correction unit 230 may calculate a correction value CV on the second state of charging SOC2 based on the first state of charging SOC1 or an output state of charging SOCout.

The correction unit 230 may increase the correction value CV when reliability on the first state of charging SOC1 or the output state of charging SOCout is high, and decrease the correction value CV when the reliability is low. Thus, the reliability on the first state of charging SOC1 or a previous output state of charging SOCout may be reflected to an output state of charging SOCout.

In operation S140, an SOC processing unit 240 may calculate an output state of charging SOCout using an accumulated correction value SOCoffset and the second state of charging SOC2. When the first state of charging SOC1 is larger than the output state of charging SOCout, the SOC processing unit 240 may calculate the accumulated correction value SOCoffset by adding the accumulated correction value SOCoffset and the correction value CV. When the first state of charging SOC1 is smaller than the output state of charging SOCout, the SOC processing unit 240 may calculate the accumulated correction value SOCoffset by subtracting the correction value CV from the accumulated correction value SOCoffset. The SOC processing unit 240 may calculate the output state of charging SOCout by adding the second SOC and the accumulated correction value SOCoffset.

As described above, in operation S110, an error may be generated when the OCV is estimated. In operation S120, the state of charging SOC may be estimated according to the Coulomb counter method, so that an error (e.g., ADC offset) generated at an SOC estimating operation (e.g., a current measuring operation) is integrated and continues to increase.

An SOC estimation error generated in operation S110 may be more than an SOC estimation error generated in operation S120 in the short term. However, the SOC estimation error generated in operation S110 may vary within a constant range in the long term without divergence. On the other hand, an SOC estimation error generated in operation S120 may be less than an SOC estimation error generated in operation S110 in the short term. However, the SOC estimation error generated in operation S120 may be accumulated due to integration in the long term.

With a remaining battery life measuring method of the inventive concept, an accumulated correction value SOCoffset may be generated by generating a correction value CV based on reliability of an SOC estimated in operation S110 or a previously generated output state of charging SOCout, and by accumulating the correction value CV. An output state of charging SOCout may be calculated by adding an SOC estimated in operation S120 and the accumulated correction value SOCoffset. Thus, it is possible to prevent an error on an SOC estimated in operation S120 from being accumulated. Also, it is possible to reduce an SOC estimation error generated in the short term when a battery time remaining is measured. Also, it is possible to maintain an SOC estimation error generated in the long term within a constant range when a battery time remaining is measured. Thus, a battery time remaining may be measured as accurately as possible.

Figure 8:
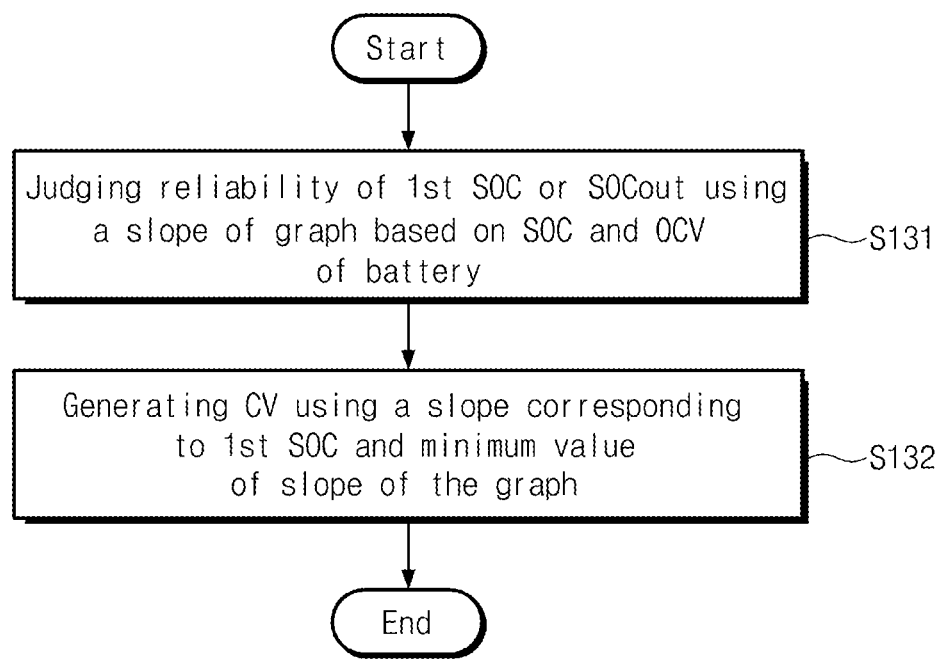
FIG. 8 is a detailed flowchart of an operation of FIG. 7.

FIG. 8 is a detailed flowchart of operation S130 of FIG. 7.

Referring to FIG. 8, operation S130 of generating a correction value CV on a second SOC based on a first SOC or an output state of charging SOCout may include judging reliability of a first SOC or the reliability of an output state of charging SOCout using a slope of a graph indicating a variation in OCV to a state of charging SOC (S131); and generating a correction value CV using a slope S of a point, corresponding to the first state of charging SOC1, of a graph indicating a variation in the OCV to the state of charging SOC and a minimum value of the slope of the graph (S132).

In operation S131, a reliability judging unit 231 (refer to FIG. 3) may judge the reliability of the first SOC or the output state of charging SOCout using a graph indicating a variation in the OCV to the state of charging SOC stored in database beforehand. The graph indicating a variation in the OCV to the state of charging SOC may correspond to a graph illustrated in FIG. 4A.

For example, in operation S131, if a slope S of a point of the graph corresponding to the first SOC or the output state of charging SOCout is large, the reliability judging unit 231 may determine the reliability to be high. For example, if a slope S of a point of the graph corresponding to the first SOC or the output state of charging SOCout is larger than a desired value (that may or may not be predetermined), the reliability judging unit 231 may determine the reliability to be high.

In operation S132, a correction value generator 232 (refer to FIG. 3) may calculate a correction value CV using the above-described equation (1). That is, in operation S132, the correction value generator 232 may calculate the correction value CV, using a slope S of a point corresponding to the first SOC generated in operation S131 and a minimum value of a slope Smin of the graph, or a slope S of a point corresponding to the output state of charging SOCout and a minimum value of a slope Smin of the graph.

Figure 9:
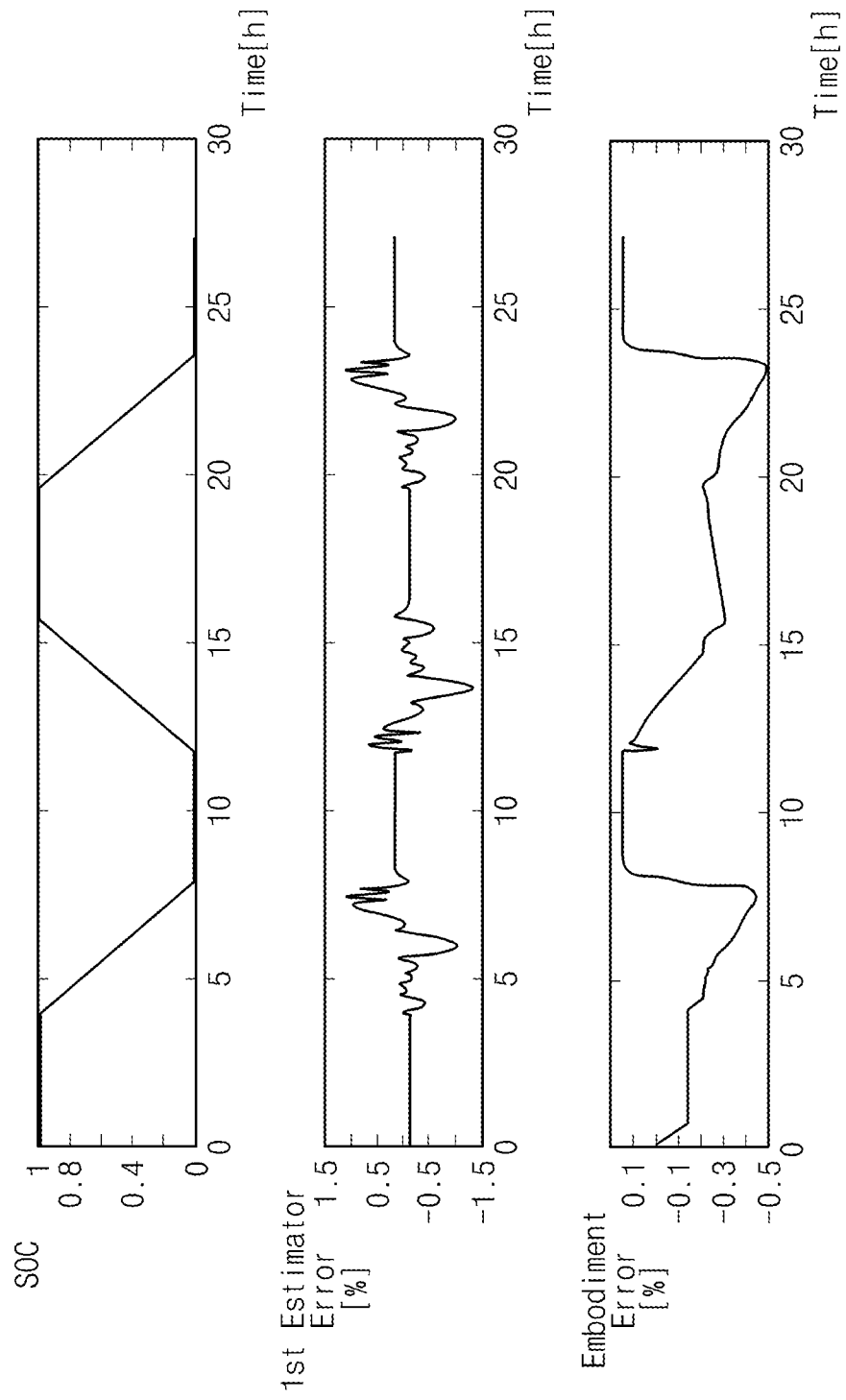
FIGS. 9 to 11 are graphs showing a measurement result of a remaining battery life measuring device of the inventive concept and an estimation result of a first estimator.
Figure 10:
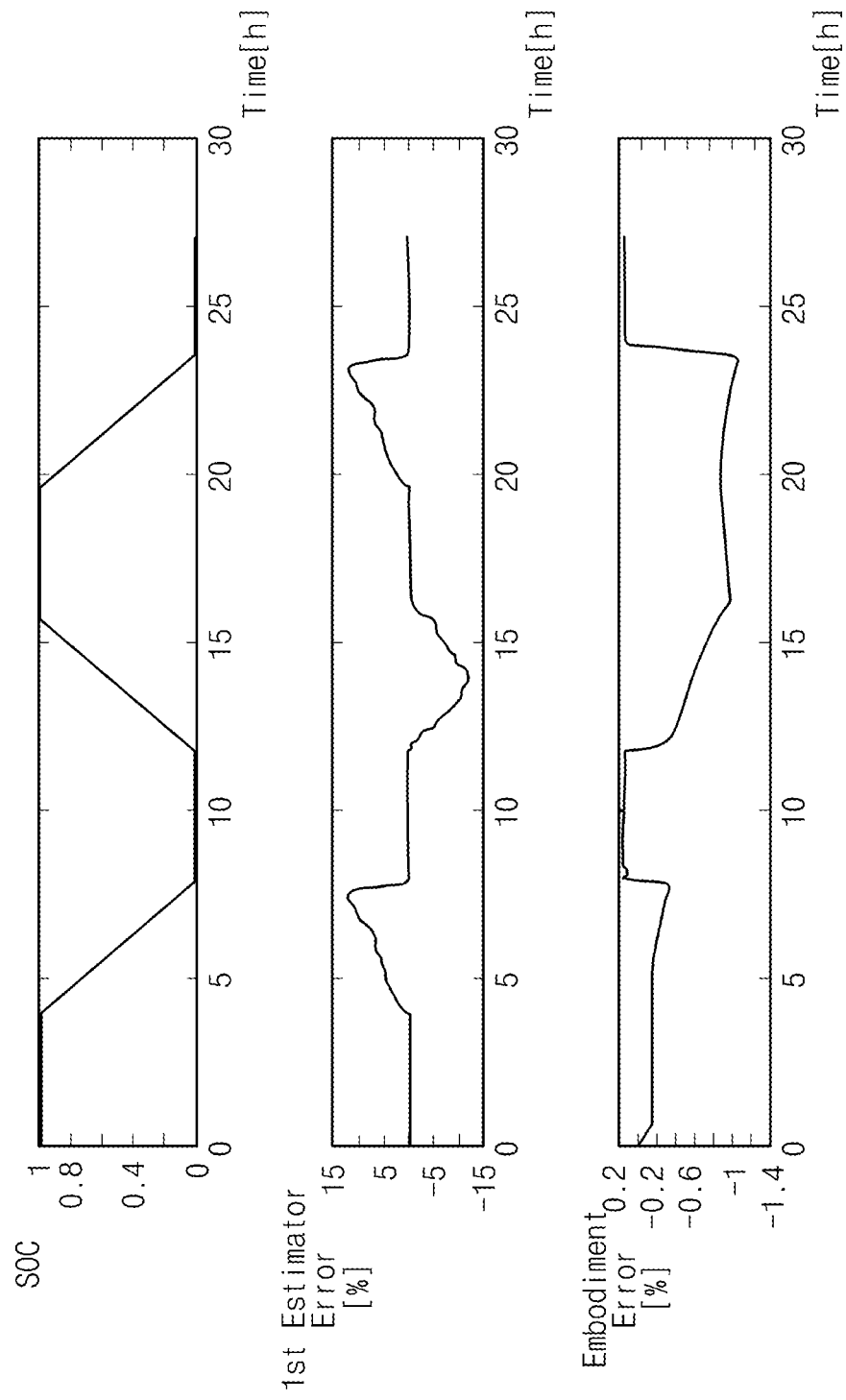
Figure 11:
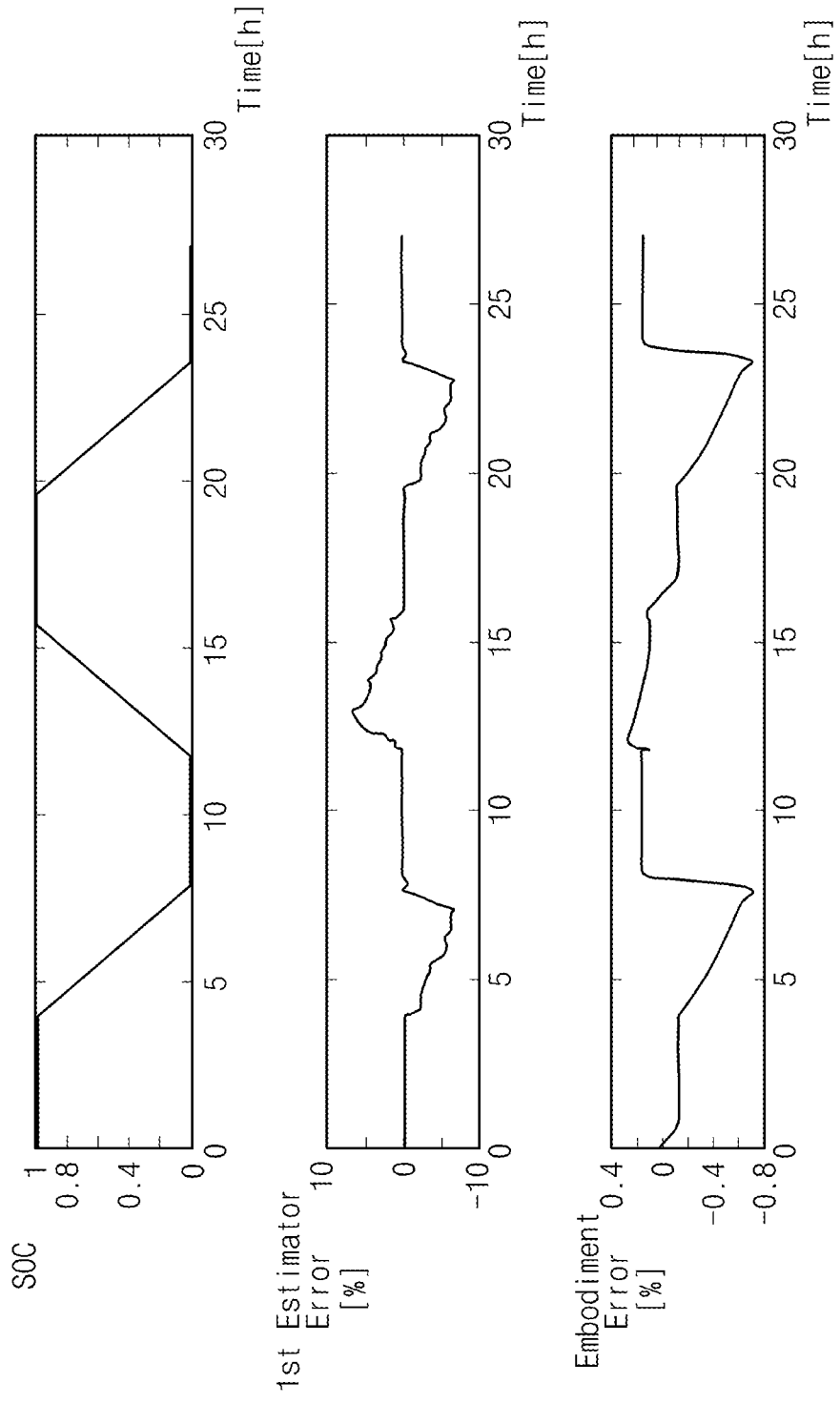

FIGS. 9 to 11 are graphs showing a measurement result of a remaining battery life measuring device of the inventive concept and an estimation result of a first estimator 210.

In FIG. 9, there are illustrated a state of charging SOC according to a lapse of time, an SOC estimation error of a first estimator 210 according to a lapse of time, and an error of an output state of charging SOCout, which are generated in the event that an internal conductance estimation error of a battery 100 does not exist when the first estimator 210 estimates an OCV.

In FIG. 10, there are illustrated a state of charging SOC according to a lapse of time, an SOC estimation error of a first estimator 210 according to a lapse of time, and an error of an output state of charging SOCout, which are generated in the event that an internal conductance estimation error of a battery 100 is two times more than actual internal conductance when the first estimator 210 estimates an OCV.

In FIG. 11, there are illustrated a state of charging SOC according to a lapse of time, an SOC estimation error of a first estimator 210 according to a lapse of time, and an error of an output state of charging SOCout, which are generated in the event that an internal conductance estimation error of a battery 100 is half (0.5 times) of actual internal conductance when the first estimator 210 estimates an OCV.

In each graph, a unit of a horizontal axis may be an hour [h], and a unit of a vertical axis may be a percentage on an SOC estimation error of the first estimator 210 and an error of an output state of charging SOCout.

In case of an SOC according to a lapse of time, a period having a slope of 0 may indicate a period where a battery is fully charged or discharged. For example, a period where the value of SOC is 1 may indicate a period where a battery is fully charged. A period where the value of SOC is 0 may indicate a period where a battery is fully discharged. A period where a slope is not 0 may indicate a period where the battery 100 is being charged or discharged.

In case of FIG. 9, an SOC estimation error of the first estimator 210 may be about −1% to 1%, while an error of an output state of charging SOCout is about −0.4% to 0.1%. In case of FIG. 10, an SOC estimation error of the first estimator 210 may be about −10% to 10%, while an error of an output state of charging SOCout is about −1% to 0.2%. In case of FIG. 11, an SOC estimation error of the first estimator 210 may be about −5% to 5%, while an error of an output state of charging SOCout is about −0.6% to 0.2%. That is, an error of an output state of charging SOCout is maintained within the much narrower range than an SOC estimation error of the first estimator 210, in each case.

An error of an output state of charging SOCout measured by a remaining battery life measuring device according to some example embodiments of the inventive concept may be smaller (about $\frac{1}{10}$) than an error of a state of charging SOC estimated by the first estimator 210. And, even if an estimation error of the first estimator 210 is large when an estimation error on internal conductance of a battery reaches 100%, an output SOC estimation error is maintained within a narrow range. Also, an output SOC estimation error may not be accumulated during a lapse of time.

Figure 12:
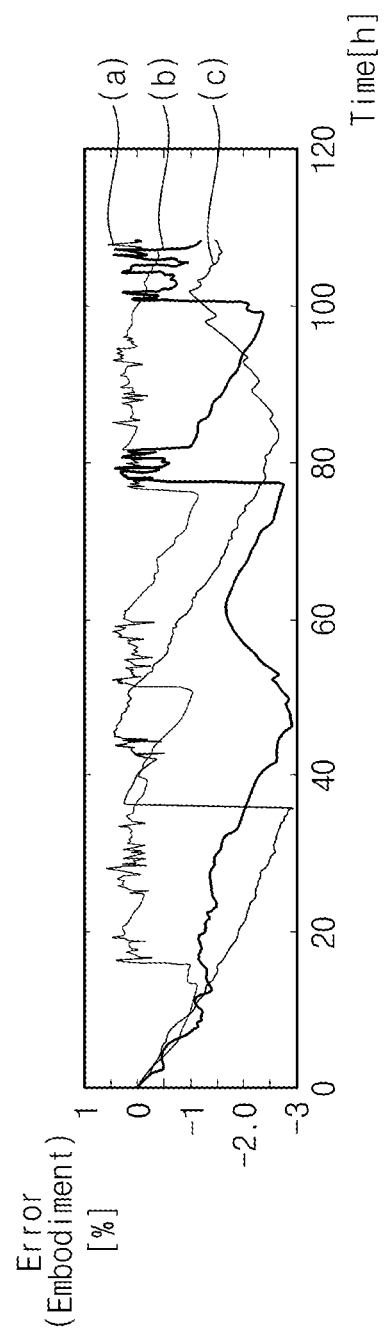
FIG. 12 is a graph showing a measurement result of a remaining battery life measuring device of the inventive concept when a battery is irregularly charged and discharged.

FIG. 12 is a graph showing a measurement result of a remaining battery life measuring device of the inventive concept when a battery is irregularly charged and discharged.

Referring to FIG. 12, there is illustrated an output state of charging SOCout output from an SOC processing unit 240 according to a lapse of time.

A case (a) may show an error of an output state of charging SOCout in the event that an internal conductance estimation error of a battery 100 does not exist when a first estimator 210 estimates an OCV.

A case (b) may show an error of an output state of charging SOCout in the event that an internal conductance estimation error of the battery 100 is two times more than actual conductance when the first estimator 210 estimates an OCV.

A case (c) may show an error of an output state of charging SOCout in the event that an internal conductance estimation error of the battery 100 is half (0.5 times) of actual conductance when the first estimator 210 estimates an OCV.

Errors of the output state of charging SOCout corresponding to the cases (a), (b), and (c) may be different from one another. In the case (a), an error of the output state of charging SOCout may be about −1% to 1%. In the case (b), an error of the output state of charging SOCout may be about −3% to 0.5%. In the case (c), an error of the output state of charging SOCout may be about −2.5% to 0.5%. As a time elapses, errors of the output state of charging SOCout corresponding to the cases (a), (b), and (c) vary within a constant range without divergence. Also, in a period where the reliability of the first estimator 210 is high, an SOC estimation error may be corrected to have a value approximate to 0.

Thus, a battery time remaining may be measured as accurately as possible by minimizing an error due to SOC estimation of the first estimator 210 and SOC estimation of the second estimator 220.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A remaining battery life measuring device, comprising:
a first estimator configured to generate a first estimation of a state of charging of a battery in a closed circuit based on an estimate of an open circuit voltage of the battery in the closed circuit;
a second estimator configured to generate a second estimation of the state of charging of the battery in the closed circuit using at least one of a charge current and a discharge current of the battery in the closed circuit;
a correction unit configured to generate a correction value on the state of charging estimated by the second estimator, based on the first estimation of the state of charging generated by the first estimator or an output state of charging,
estimate a reliability value associated with the first estimation or the output state of charging, based on a determined error rate associated with the first estimation, increase the correction value if the estimated reliability value is greater than a first value, and
decrease the correction value if the estimated reliability value is less than a second value; and a state of charging (SOC) processing unit configured to calculate the output state of charging using the second estimation of the state of charging generated by the second estimator and an accumulated correction value, wherein the accumulated correction value is generated based on the correction value, such that the SOC processing unit calculates the output state of charging based on both the first estimation of the state of charging and the second estimation of the state of charging.

2. The device of claim 1, wherein the SOC processing unit is further configured to,
add the accumulated correction value and the correction value when the first estimation of the state of charging generated by the first estimator is greater than the output state of charging, and
subtract the correction value from the accumulated correction value when first estimation of the state of charging generated by the first estimator is smaller than the output state of charging.

3. The device of claim 1, wherein the first estimator comprises a table in which correspondence information between the open circuit voltage and the state of charging is stored.

4. The device of claim 1, wherein the SOC processing unit is further configured to calculate the output state of charging based on adding the second estimation of the state of charging generated by the second estimator and the accumulated correction value.

5. The device of claim 1, wherein the correction unit comprises:
a reliability judging unit configured to estimate the reliability value associated with the output state of charging or the reliability value associated with the first estimation of the state of charging, based on correspondence information between the open circuit voltage and the state of charging; and
a correction value generator configured to calculate the correction value based on the estimated reliability value associated with the output state of charging or the estimated reliability value associated with the first estimation of the state of charging.

6. The device of claim 1, wherein the second estimator is further configured to estimate the state of charging by integrating the at least one of the charge current and the discharge current.

7. The device of claim 5, wherein,
the correspondence information between the open circuit voltage and the first estimation of the state of charging comprises a graph indicating a variation in the open circuit voltage to the state of charging, and
the reliability judging unit is further configured to estimate the reliability value associated with the first estimation of the state of charging based on a slope of a point of the graph corresponding to the output state of charging or the first estimation of the state of charging.

8. The device of claim 7, wherein the reliability judging unit is further configured to,
determine that the reliability value associated with the first estimation of the state of charging is greater than the first value when the slope of the point corresponding to the output state of charging or the slope of the point corresponding to the first estimation of the state of charging is greater than a third value.

9. The device of claim 7, wherein the correction value generator is further configured to,
calculate the correction value based on a minimum value of the slope of the graph and the slope of the point of the graph corresponding to the first estimation of the state of charging, and
wherein calculate the correction value based on the minimum value of the slope of the graph and the slope of the point corresponding to the output state of charging.

10. A remaining battery life measuring device, comprising:
a first unit configured to generate a first estimation of a state of charging of a battery in a closed circuit based on an estimate of an open circuit voltage of the battery in the closed circuit;
a second unit configured to generate a second estimation of the state of charging of the battery in the closed circuit based on a current of the battery in the closed circuit;
a third unit configured to,
generate a correction value on the second estimation of the state of charging generated by the second unit, based on the first estimation of the state of charging generated by the first unit or an output state of charging,
estimate a reliability value associated with the first estimation or the output state of charging, based on a determined error rate associated with the first estimation,
increase the correction value when the estimated reliability value is greater than a first value,
decrease the correction value when the estimated reliability value is smaller than a second value; and
a processor configured to calculate the output state of charging based on the second estimation of the state of charging generated by the second unit and an accumulated correction value wherein the accumulated correction value is generated based on the correction value, such that that the processor calculates the output state of charging based on both the first estimation of the state of charging and the second estimation of the state of charging.

11. The device of claim 10, wherein the second unit is configured to generate the second estimation of the state of charging of the battery based on a charge current of the battery.

12. The device of claim 10, wherein the second unit is configured to generate the second estimation of the state of charging of the battery based on a discharge current of the battery.

13. The device of claim 10, wherein the second unit is configured to generate the second estimation of the state of charging of the battery based on charge and discharge currents of the battery.

14. The device of claim 10, wherein the processor is further configured to add the accumulated correction value and the correction value when the first estimation of the state of charging generated by the first unit is greater than the output state of charging.

15. The device of claim 10, wherein the processor is further configured to subtract the correction value from the accumulated correction value when the first estimation of the state of charging generated by the first unit is smaller than the output state of charging.

16. The device of claim 10, wherein the first unit comprises a table in which correspondence information between the open circuit voltage and the state of charging is stored.

17. The device of claim 10, wherein the processor is further configured to calculate the output state of charging based on adding the second estimation of the state of charging generated by the second unit and the accumulated correction value.

18. The device of claim 10, wherein the third unit comprises:
 a first sub-unit configured to estimate the reliability value associated with the output state of charging or the reliability value associated with the first estimation of the state of charging based on correspondence information between the open circuit voltage and the state of charging.

19. The device of claim 18, wherein the third unit further comprises:
 a second sub-unit configured to calculate the correction value based on the estimated reliability value associated with the output state of charging or the estimated reliability value associated with the first estimation of the state of charging.

20. The device of claim 19, wherein the correspondence information between the open circuit voltage and the first estimation of the state of charging comprises a graph indicating a variation in the open circuit voltage to the state of charging.

\* \* \* \* \*